United States Patent [19]

Hiruta

[11] Patent Number: 5,138,433
[45] Date of Patent: Aug. 11, 1992

[54] MULTI-CHIP PACKAGE TYPE SEMICONDUCTOR DEVICE

[75] Inventor: Yoichi Hiruta, Matsudo, Japan

[73] Assignee: Kabushiki Kaisha Toshiba, Kawasaki, Japan

[21] Appl. No.: 670,270

[22] Filed: Mar. 15, 1991

[30] Foreign Application Priority Data

Mar. 16, 1990 [JP] Japan ................................. 2-66683

[51] Int. Cl.⁵ ............................................. H01L 23/28
[52] U.S. Cl. .................................... 357/72; 357/74; 357/75; 357/80
[58] Field of Search .......................... 357/72, 74, 75, 80

[56] References Cited

U.S. PATENT DOCUMENTS

| | | | |
|---|---|---|---|
| 4,330,790 | 5/1982 | Burns | 357/72 |
| 4,729,010 | 3/1988 | Tsuchiya et al. | 357/80 |
| 4,742,385 | 5/1988 | Kohmoto | 357/75 |
| 4,962,415 | 10/1990 | Yamamoto et al. | 357/72 |
| 5,036,024 | 7/1991 | Mine et al. | 357/72 |

FOREIGN PATENT DOCUMENTS 0107149  5/1988  Japan ..................................... 357/75

OTHER PUBLICATIONS

IMC 1988 Proceedings, Tokyo, May 25-27, 1988, pp. 338-344, "Properties of Wiring on Metal Plate Coated with Alumina at High Frequency and Ultra-High Frequency".

Primary Examiner—Georgia Y. Epps
Attorney, Agent, or Firm—Finnegan, Henderson, Farabow, Garrett and Dunner

[57] ABSTRACT

In a multi-chip package type semiconductor device, semiconductor chips are bonded directly on a bed or a package substrate. This feature improves the head radiation characteristic of the device so that heat generated at the semiconductor chips is effectively dissipated.

15 Claims, 7 Drawing Sheets

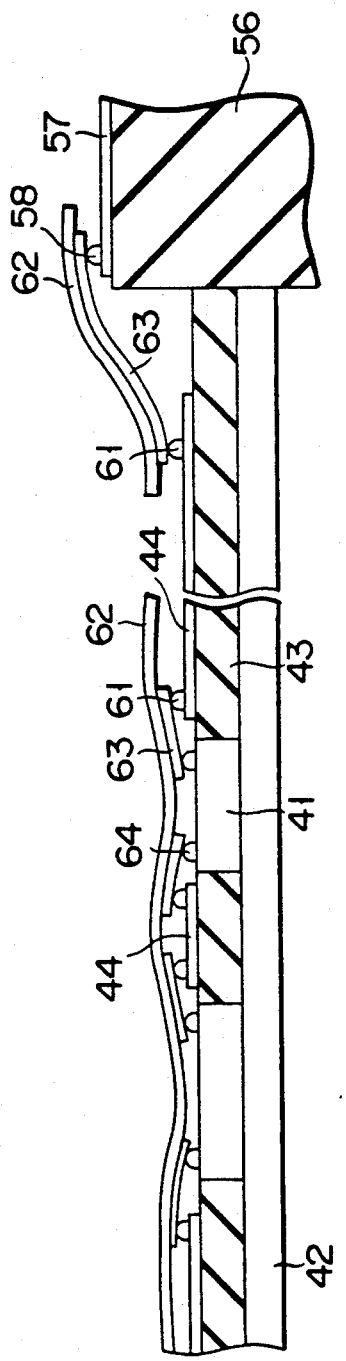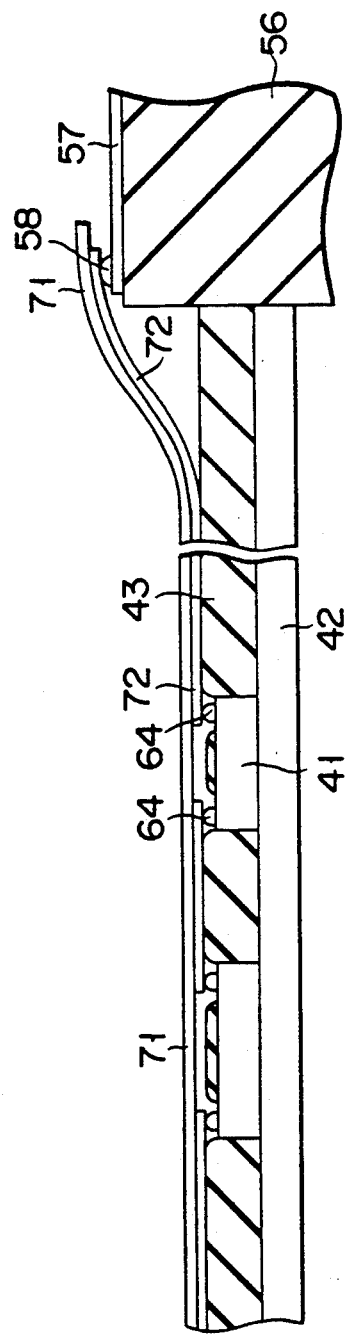
FIG. 11
FIG. 12

MULTI-CHIP PACKAGE TYPE SEMICONDUCTOR DEVICE

BACKGROUND OF THE INVENTION

1. Field of the Invention

This invention relates to a multi-chip package type semiconductor device, in which a plurality of semiconductor chips are mounted in the same package.

2. Description of the Related Art

Known semiconductor devices of the multi-chip package type are illustrated in FIGS. 1 and 2. In FIG. 1, semiconductor chips 11 used for example as LSI memories are mounted on a bed 12 made, for example, of a Fe(42 wt %)-Ni alloy via an alumina film 13 and an aluminum film 14. Interconnection between the semiconductor chips 11 is effected by a bonding wire 15, using the aluminum film 14 on the alumina film 13 as a wiring layer. Interconnection between each semiconductor chip 11 and a lead 16 is likewise by way of the bonding wire 15, using the aluminum film 14 on the alumina film 13 as a wiring layer.

In the device shown in FIG. 2, semiconductor chips 22 are mounted on a wiring substrate $23_1$ located beneath a bed $23_2$ via bumps 21. The provision of the bumps 21 disallows the semiconductor chips to be directly connected to the elements constituting the package. In FIG. 2, reference numeral 24 represents an aluminum fin, 25 an adhesive of high heat-conductivity, 26 a lead, 27 a mullite flange, 28 an alumina cap, 29 a sealing adhesive, and 30 a sealing adhesive.

Turning to the known device illustrated in FIG. 1, the alumina film interposed between the chips 11 and the bed 12 results in poor heat removing characteristics from the chips.

Referring again to FIG. 2, while the heat removing rate of the structure ranging from the beds $23_1$, $23_2$ to the aluminum fin 24 is high, they are low in regard to the heat generated at the semiconductor chips because of the bump 21 intervening between the chips 22 and the bed $23_1$.

Measures associated with the removing of the chip-generated heat in such known devices have been insufficient and have resulted in the elevated temperature of the chips, with an adverse effect on circuit functioning.

SUMMARY OF THE INVENTION

The invention has been accomplished to obviate the foregoing problems and has for its object to provide a multi-chip package type semiconductor device having improved heat transfer properties for the semiconductor chips.

The device according to this invention is featured by directly bonding semiconductor chips onto a bed or a package substrate. More specifically, improved heat transfer properties are obtained by mounting the semiconductor chips directly onto the bed or the package substrate.

The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

FIG. 11 is a cross-sectional view of a modification of the semiconductor device shown in FIG. 5C; and FIG. 12 is a cross-sectional view of a modification of the semiconductor device shown in FIG. 6C.

DETAILED DESCRIPTION OF THE PREFERRED EMBODIMENTS

Figure 3:
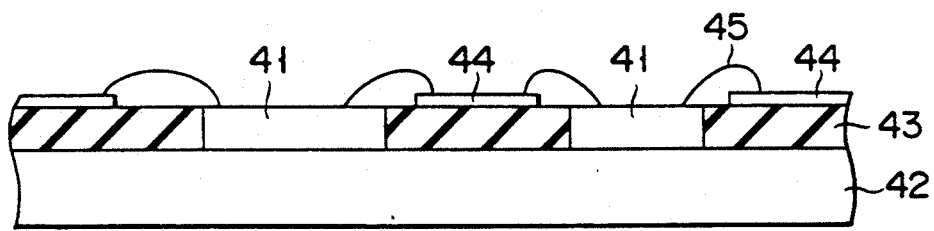
FIG. 3 is a cross-sectional view of a multi-chip package type semiconductor device according to an embodiment of the invention.

In FIG. 3 showing an embodiment of the invention, a plurality of semiconductor chips 41 is directly bonded at the back surfaces on a bed 42. Between the semiconductor chips 41 on the bed 42 are formed high-insulation films 43 of, for example, polyimide. A wiring layer 44 of copper is formed on the polyimide films. Interconnection of the semiconductor chips 41 is attained by the wiring layer 44 and a bonding wire 45 which connects the wiring layers and the semiconductor chips 41.

Material used for the bed 42 may be an iron-nickel alloy or copper. The structure of FIG. 3 is further sealed by an organic resin, though not shown.

Figure 1:
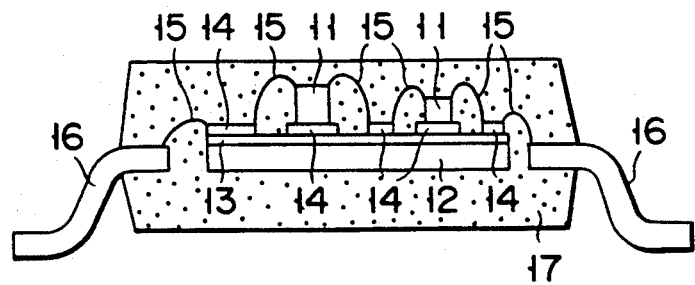
FIG. 1 is a cross-sectional view of a conventional multi-chip package type semiconductor device.
Figure 2:
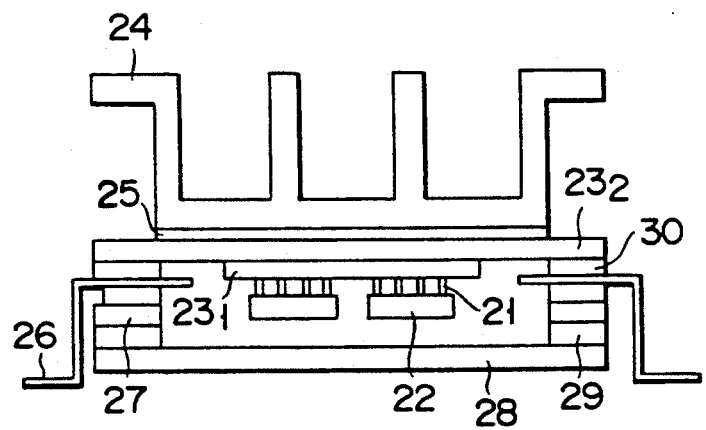
FIG. 2 is a cross-sectional view of another conventional device.

In the embodiment of FIG. 3, it is to be noted that an alumina film such as shown by 13 in the FIG. 1 device is not provided between the semiconductor chips 41 and the bed 42. Instead, the chips 41 and the bed 42 are directly bonded together so that the heat generated at the semiconductor chips 41 is highly conductive towards the bed 42.

Figure 4:
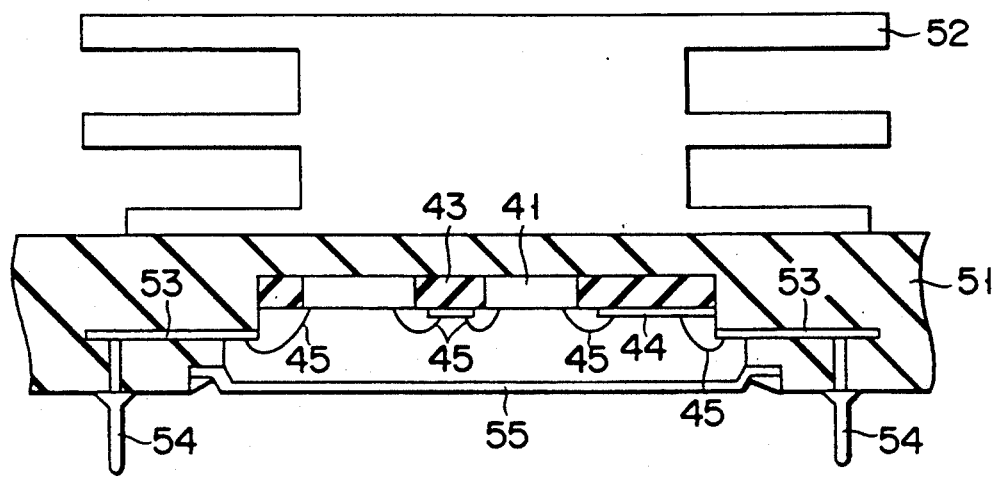
FIG. 4 is a cross-sectional view a device according to another embodiment of the invention.

FIG. 4 illustrates a second embodiment of the invention, wherein the invention is applied to a ceramic package and the semiconductor chips are sealed in the ceramic package.

As is shown, semiconductor chips 41 are directly mounted on their back surfaces onto the ceramic package 51 and high-insulation films 43, for example, of polyimide are formed between the semiconductor chips. A copper wiring layer 44 is formed on the polyimide film 43. The semiconductor chips are interconnected by a bonding wire 45 through the wiring layer 44. While the semiconductor chips in this embodiment are directly mounted on the ceramic package, a bed may be disposed between the semiconductor chips and the ceramic package. On the ceramic package 51 is formed a wiring layer 53, to which a pin (wiring terminal) inserted into the package 51 is connected. The wiring layer 53 is connected to the wiring layer 44 by the bonding wire 45, thus providing for a current path leading from the chips 41 to the pin. A lid 55 is disposed on the package 51 to protect the structure including the semiconductor chips. On the back surface of the package 51 is attached a fin 52 for heat radiation.

Where it is desired to use a plastic package in place of the ceramic package, it is preferred, to avoid exfoliating of the plastic molding, to provide a bed and to form anchor holes in the bed.

Figure 5A:
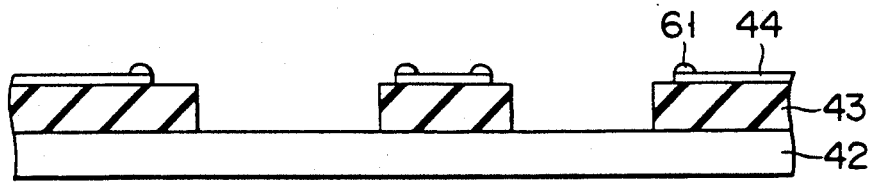
FIGS. 5A to 5C are cross-sectional views of the device according to a further embodiment of the invention.
Figure 5B:
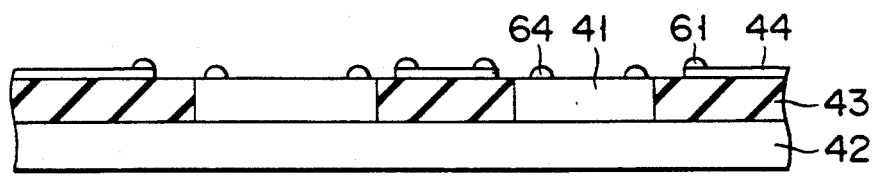
Figure 5C:
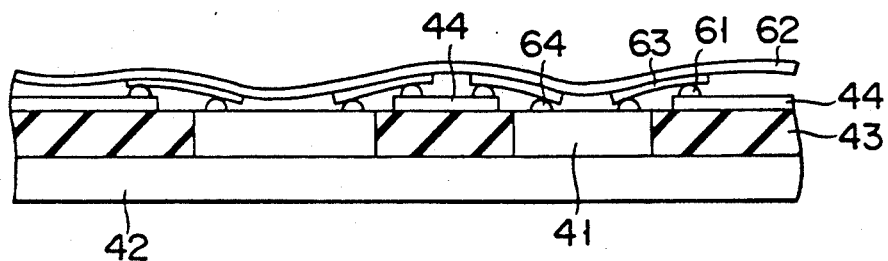

FIGS. 5A to 5C illustrate a further embodiment of the present invention. This embodiment employs tape automated bonding (TAB) for interconnection of semiconductor chips. As shown in FIG. 5A, a high-insulation film 43, for example, of polyimid may be formed on a bed 42, followed by being coated by a wiring pattern 44 of copper, on which an electrode 61 is subsequently formed. Thereafter, a semiconductor chip 41 carrying an electrode 64 is directly bonded to the bed 42 in the manner shown in FIG. 5B. As shown in FIG. 5C, interconnections between the electrode 64 mounted on the semiconductor chip 41 and the electrode 61 mounted o the wiring pattern 44, and interconnections between the electrode 64 and an externally extending lead (not shown) are effected by tape bonding, using a wiring pattern 63 detachably bonded on the tape 62. More specifically, the position of the tape 62 is so selected as to permit the wiring pattern to cover the elements to be interconnected, followed by press engaging the tape 62 onto the semiconductor structure to achieve connection of the desired elements.

Figure 6A:
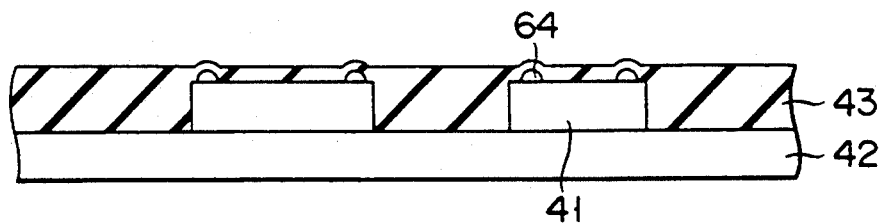
FIGS. 6A and 6C are cross-sectional view, of the device according to a still further embodiment of the invention.
Figure 6B:
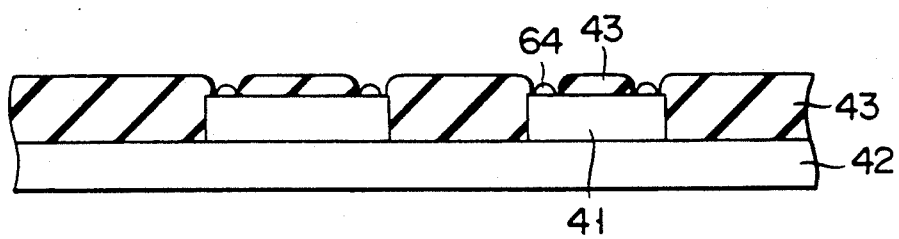
Figure 6C:
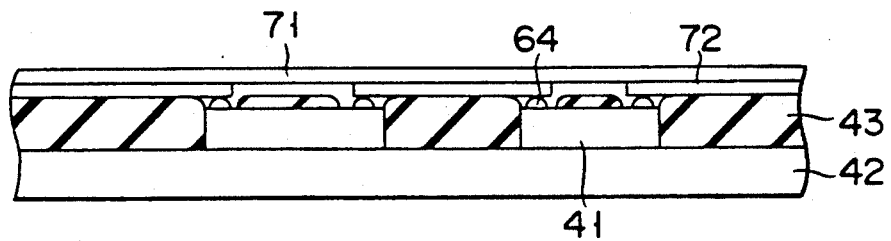

FIGS. 6A to 6C illustrate a further embodiment of the invention. Differing from the embodiments shown in FIG. 3 and FIGS. 5A to 5C, the Cu wiring layer is not formed on the polyimide film 43, but instead replaced by a wiring pattern detachably bonded to an insulating tape 71.

As shown in FIG. 6A, after having the semiconductor chip 41 directly bonded to the bed 42, polyimide is uniformly deposited over the semiconductor structure to form the polyimide film 43 of a thickness of 400–500 $\mu$m so as to embed the semiconductor chip 41. Then, that part of the polyimide film 43 which overlies the electrode 64 on the semiconductor chip 41 is removed as shown in FIG. 6B. As shown in FIG. 6C, a wiring layer 72 of copper is then placed on the semiconductor structure by press fixing a detachable bonding tape 71 over the structure to achieve interconnection of the semiconductor chips. As illustrated, the wiring layer 72 extends from the electrode 64 on the semiconductor chip 41 to the electrode 64 mounted on an adjacent semiconductor chip, and the bonding tape is pressedly applied onto the semiconductor structure carrying the wiring layer.

Figure 7:
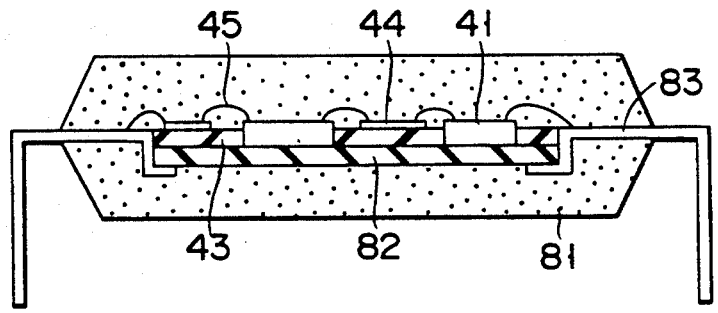
FIGS. 7 and 8 show cross-sectional views illustrating further embodiments of the invention.

FIG. 7 shows a still further embodiment of the invention.

In this embodiment, the entire semiconductor structure including semiconductor chips is sealed by a molding 81 of organic resin, typically plastics. The chip 41 is directly bonded onto an alumina substrate or an insulation substrate 82, which is in contact with an inner lead 83 of a lead terminal. To avoid the exfoliating of the plastic molding 81, anchor holes may preferably be provided in the substrate 82.

Figure 8:
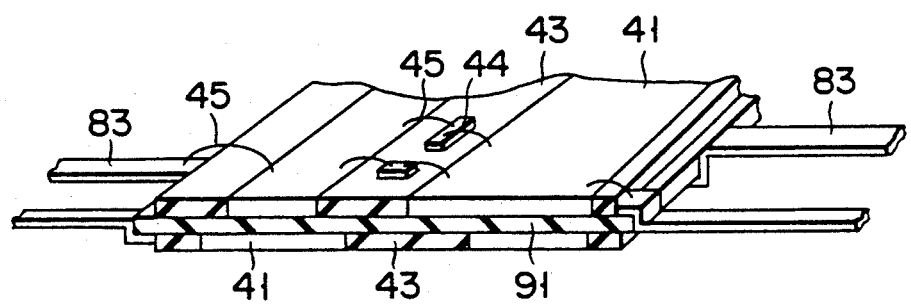

FIG. 8 shows a further embodiment of the invention.

The embodiment employs a substrate 91 made of an insulating material of high heat-conductivity, such as N. Semiconductor chips 41 are mounted on both surfaces of the substrate 91. An inner lead 83 for one semiconductor chip 41 and an inner lead 83 for the other semiconductor chip 41 are oriented in opposite directions at respective ends such that these inner leads 83 permit the substrate 91 to be sandwiched between both semiconductor chips 41. A high heat-conductive bed may be used as the substrate 91.

In the foregoing embodiments, the semiconductor chip 41 has been directly bonded on the bed 42, or the N substrate 91 or the package substrate 51, having a function equivalent the bed. Therefore, the heat resistance of the structure ranging from the semiconductor chip 41 to the bed 42; or the heat resistance of the structure ranging from the semiconductor chip 41 to the substrate 91 or 51 is decreased, which results in decrease in heat resistance of the structure including the package; and accordingly in improving the heat radiation properties for the heat generated at the semiconductor chip 41.

In the structure shown in FIG. 7 and FIG. 8, since a heat transfer path is established leading from the semiconductor chip 41 to the lead 83 via the substrate 82, heat transfer properties are further enhanced.

Figure 9:
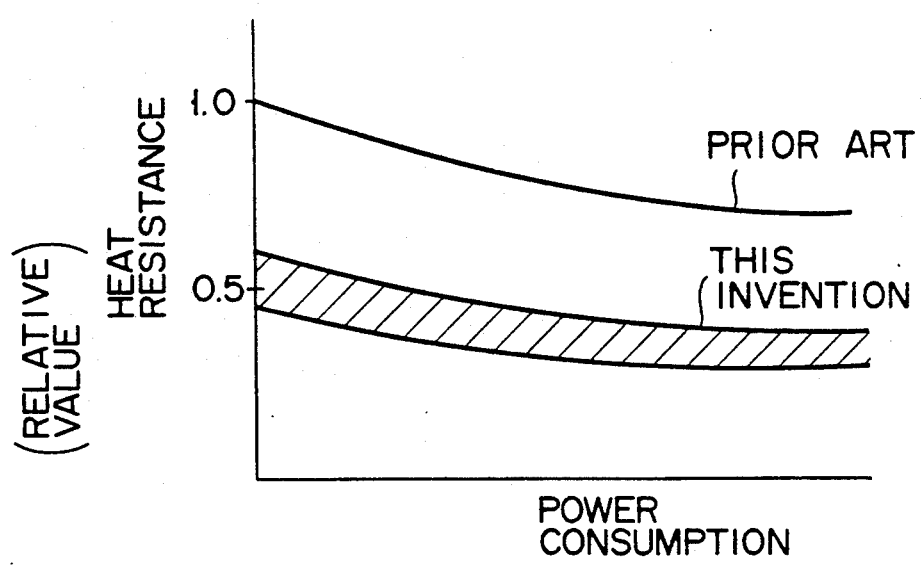
FIG. 9 is a graph showing power consumption - heat radiation characteristics of the conventional and the present devices.

FIG. 9 shows a graph of power consumption vs. heat resistance characteristics of the conventional device shown in FIG. 1, and of each of the device according to the foregoing embodiments. Measurements have been carried out for the conventional device and devices according to this invention, without use of a heat radiation fin and in a still air condition. It is apparent from FIG. 9 that the heat resistance of the devices according to this invention is decreased approximately by 30 to 50% in comparison with that of the conventional device.

In those of the embodiments in which tape automated boding is used for interconnecting the semiconductor chips, particularly in the embodiment shown in FIGS. 6A to 6C, the pitch of the semiconductor chips has been reduced to about one half of that of the semiconductor chips according to the conventional device, thus resulting in improved packing density.

Figure 10:
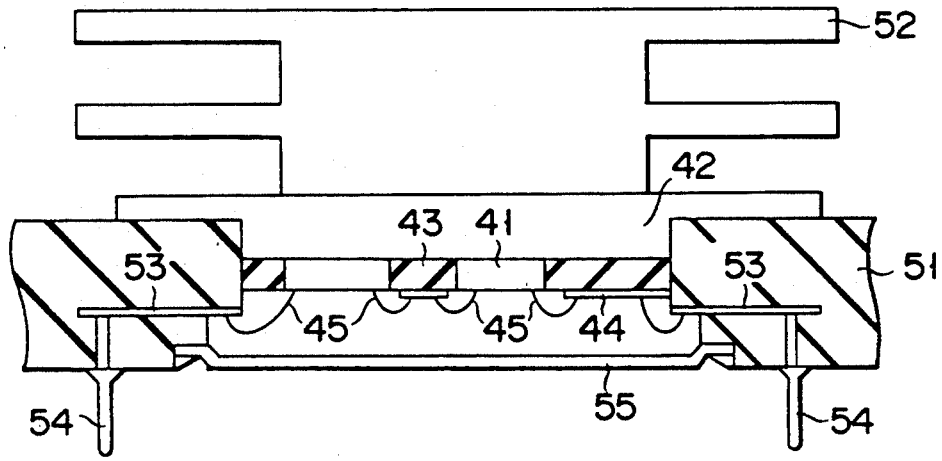
FIG. 10 is a cross-sectional view of a modification of the semiconductor device shown in FIG. 4.

FIG. 10 shows a modification of the semiconductor device shown in FIG. 4. In the modification, a bed 42 is provided between the semiconductor chips 41 and the heat radiation fin 52 and the semiconductor chips 41 are mounted on the bed 42 attached to the heat radiation fin 52.

FIG. 11 shows a modification of the semiconductor device shown in FIG. 5C. In the modification, an interconnection between the electrode 61 formed on the wiring layer 44 and an electrode 58 formed on an externally extending lead 57 on a package 56 is effected by automated tape bonding.

FIG. 12 shows a modification of the semiconductor device shown in FIG. 6C. In the modification, an interconnection between the electrode 64 formed on the semiconductor chip 41 and an electrode 58 formed on an externally extending lead 57 on a package 56 is effected by automated tape bonding.

The invention is not limited to the above embodiments, but may be put into practice in variously modified forms. For example, materials of the bed and the package substrate are not limited to those described above, but other materials having equivalent characteristics, for example, a Cu-W alloy, Mo or Si may be employed. Further, the interconnection of semiconductor chip need not be performed by a single method. For example, tape automated bonding may be used for interconnecting some of the semiconductor chips and bonding wires may be used for connecting the remaining semiconductor chips.

As has been described, the multi-chip package type semiconductor device of the invention exhibits improved removing properties for the semiconductor chip generated heat because of a structure in which semiconductor chips are mounted directly onto the bed or the package substrate.

What is claimed is:

1. A semiconductor device in which a plurality of semiconductor chips are mounted on the same package, comprising:
   semiconductor chips directly bonded onto a bed or a package substrate; and
   an insulative resin filled between said plurality of semiconductor chips mounted on the bed or the package substrate.

2. The semiconductor device according to claim 1, wherein said package substrate is in contact with an inner lead of at least one lead terminal.

3. The semiconductor device according to claim 1, wherein said plurality of semiconductor chips are interconnected through wiring patterns formed on said resin filled between the semiconductor chips.

4. The semiconductor device according to claim 3, wherein at least part of the interconnections of said plurality of wiring patterns and said plurality of semiconductor chips are effected by bonding wires.

5. The semiconductor device according to claim 3, wherein at least part of the interconnections of said plurality of wiring patterns and said plurality of chips are effected by tape automated bonding.

6. The semiconductor device according to claim 3, wherein the interconnections between said semiconductor chips are effected by tape automated bonding, and the interconnections between the semiconductor chips and externally extending leads are effected by tape automated bonding.

7. The semiconductor device according to any one of claims 1, 2, 3, 4, 5, or 6, wherein said plurality of semiconductor chips are mounted on both surfaces of said bed or said package substrate.

8. The semiconductor device according to any one of claims 1, 2, 3, 4, 5, or 6, wherein said bed or said package substrate is insulative and sandwiched by inner leads connected to the semiconductor chips mounted on both surfaces thereof.

9. The semiconductor device according to any one of claims 1, 2, 3, 4, 5, or 6, wherein said semiconductor chips are sealed by an organic resin.

10. The semiconductor device according to claim 7, wherein said semiconductor chips are sealed by an organic resin.

11. The semiconductor device according to claim 8, wherein said semiconductor chips are sealed by an organic resin.

12. The semiconductor device according to any one of claims 1, 2, 3, 4, 5, or 6, wherein said semiconductor chips are sealed in a ceramic package.

13. The semiconductor device according to claim 7, wherein said semiconductor chips are sealed in a ceramic package.

14. The semiconductor device according to claim 8, wherein said semiconductor chips are sealed in a ceramic package.

15. The semiconductor device according to claim 12, wherein a heat radiation fin is provided on a surface of said ceramic package.

* * * * *